United States Patent [19]

Jenson et al.

[11] Patent Number: 4,739,257

[45] Date of Patent: Apr. 19, 1988

[54] TESTSITE SYSTEM

[75] Inventors: Dennis Jenson; Robert Tessier, both of North St. Paul, Minn.

[73] Assignee: Automated Electronic Technology, Inc., North St. Paul, Minn.

[21] Appl. No.: 933,914

[22] Filed: Nov. 24, 1986

Related U.S. Application Data

[63] Continuation-in-part of Ser. No. 742,011, Jun. 6, 1985, Pat. No. 4,675,599.

[51] Int. Cl.⁴ ............................................. G01R 31/26
[52] U.S. Cl. ................... 324/158 F; 439/71; 439/260; 439/263
[58] Field of Search ............... 324/158 F, 158 P; 439/71, 259, 260, 263, 264

[56] References Cited

U.S. PATENT DOCUMENTS

| | | | |
|---|---|---|---|
| 3,728,667 | 4/1973 | Richelmann | 324/158 F X |
| 3,805,159 | 4/1974 | Richelmann | 324/158 F |
| 4,473,798 | 9/1984 | Cedrone et al. | 324/158 F X |
| 4,498,047 | 2/1985 | Hexamer et al. | 324/158 F |
| 4,533,192 | 8/1985 | Kelley et al. | 439/259 X |
| 4,675,599 | 6/1987 | Jensen et al. | 324/158 F |

FOREIGN PATENT DOCUMENTS 161833  9/1984  Japan ............................. 324/158 F

*Primary Examiner*—Reinhard J. Eisenzopf
*Assistant Examiner*—Stephen M. Baker
*Attorney, Agent, or Firm*—Hugh D. Jaeger

[57] ABSTRACT

Testsite system for use in an integrated circuit handler, the testsite system for testing plastic leaded chip carriers (PLCC), leadless chip carriers (LCC) and other IC packages. The testsite system utilizes a pocket in a socket which is movable in frame between an insert position for the IC and a test position for the IC. The testsite includes an ejector which operates against a first spring constant and a movable pocket assembly which operates against a second spring constant. The movable pocket in the socket provides for alignment between the IC package, and the contact wires insure positive electrical integrity. The spring action provides for ejection of an IC after test from the pocket by a spring actuated ejector, as well as the socket assembly returning to a home position while carrying the ejector and IC at the same time through the second spring action. Alternate embodiments include a testsite with air chambers within and adjacent to the testsite for a controlled testsite temperature environment. Other alternate embodiments include a testsite utilizing decoupling plates and capacitors.

6 Claims, 14 Drawing Sheets

TESTSITE SYSTEM

CROSS REFERENCES TO CO-PENDING APPLICATIONS

This is a continuation-in-part of U.S. Ser. No. 742,011, now U.S. Pat. No. 4,675,599 filed June 6, 1985, entitled "Testsite System".

BACKGROUND OF THE INVENTION

1. Field of the Invention

The present invention pertains to integrated circuit handlers, and more importantly, pertains to a testsite for integrated circuit (IC) packages of leadless chip carrier (LCC), plastic leaded chip carrier (PLCC), or other like configurations.

2. Description of the Prior Art

Prior art testsites have not provided a satisfactory testsite for PLCCs which are surface mounted integrated circuit devices. A major share of surface mounted integrated circuits being manufactured these days are PLCCs, and consequently, this presents a major problem in the industry as it is necessary to test PLCCs.

The prior art testsite contactors have not provided for contact integrity between the testsite and the pins of the IC. Such deficiencies result in rejecting what might otherwise be acceptable integrated circuits.

The present invention overcomes the deficiencies of the prior art by providing a testsite which utilizes dual spring action to engage an IC into a pocket of a socket assembly, and then reciprocate engaging the socket assembly into an electrical framework for testing. The dual reciprocating spring action provides for alignment of the IC in the pocket of the socket assembly, as well as alignment of the IC with respect to the contact wires at the testsite for electrical testing.

SUMMARY OF THE INVENTION

The general purpose of the present invention is a testsite for an IC handler which utilizes a dual reciprocal spring action for engaging the IC package into a pocket of a socket assembly on a first spring action, and engaging a socket assembly into an electrical framework for testing on a second spring action. The testsite provides for assurance of electrical contact to the contact wires, as well as contact integrity. Also, the testsite provides for mating of the IC into the pocket of the socket, and further, prevents damage to the IC during the mating of the IC to the socket assembly. The testsite is particularly useful for testing PLCCs ICs, a widely manufactured surface mount IC package.

According to one embodiment of the present invention, there is provided a testsite system including an extender, where the extender can be supported on a printed circuit board, or can have wires extending therefrom, an electrical frame supported within or about the extender and including a plurality of contact wires arranged within said frame area, a second spring supported and centered in the extender and within said contact wires, a socket assembly including a base for engaging with the second spring and of a physical size to engage and slide within the frame and over and around the contact wires, the socket assembly including a pocket for capturing and engaging and IC, such as PLCC, an ejector pin mounted within said socket area and extending downwardly into the base of the socket assembly, a first spring positioned about the ejector pin, and, a cover plate maintaining and capturing the socket assembly within the frame where the second spring biases the socket assembly up against the cover plate and the first spring biases the ejector pin upwardly in the pocket. The IC, such as a PLCC package, can engage into the pocket of the socket assembly against the ejector pin of a first spring action for alignment of the package within the socket assembly, and subsequently, the socket assembly moves downwardly into the frame against the second spring, whereupon the contact wires will come upwardly through slots on the socket assembly and engage with the leads of the IC package for a subsequent test operation to occur. Other additional embodiments provide for a ported frame assembly allowing conditioned air to enter the frame chamber for temperature controlled environmental testing; and also for capacitive plates interceded between the frame and the extender acting as a decoupling capacitor to maintain best voltage during current surges by getting the power supply next to the device.

According to other embodiments of the present invention, impedance cables of finite impedance and finite length can attach to the contact wires and extend outwardly for subsequent connection, such as through a bolt-on connector for high-frequency testing. The clamping technique also provides a matched impedance connection to testing equipment. An alternative contact wire array is provided with a common ground for controlled impedance.

According to another embodiment of the present invention, there is provided a testsite system where the extender can be mounted on a circuit board where the extender can have wires extending therefrom, an electrical frame supports within or about the extender and including a plurality of contact wires arranged within said frame area and including a rectangular ramped lip area with contact wire stabilizing grooves, a socket assembly including a base for engaging a spring of a physical size to engage and slide within the frame and around the contact wires, a top member cover including a rectangular hole for insertion of a flat bottom lead IC, and ramped surfaces for capturing of spring wire contact assemblies against surfaces of an electrical frame and support.

One significant aspect and feature of the present invention is a testsite which provides for alignment of the IC package within a pocket of a socket assembly prior to testing of the IC package.

Another significant aspect and feature of the present invention is a testsite which provides for contact integrity between contact wires and each lead of the IC. This provides for 100 percent testing of IC packages, especially the PLCC packages which are now one of the most popular packages manufactured. Other types of packages can also be tested in this testsite system.

Having thus described the embodiments of the present invention, it is the principal object thereof to provide a testsite for accurately testing IC packages, especially the PLCC IC packages.

One object of the present invention is to provide a dual spring action IC testsite, which on a first spring action aligns the IC in the testsite, and on the second spring action, provides for contact wire contact with respect to the leads of the IC.

Another object of the present invention is to provide a testsite which can utilize matched impedance cables affixed to the contact wires for high frequency testing of ICs. The cables can also include bolt-on connecting clamps for high frequency testing.

A further object of the present invention is a spring wire assembly with a common ground plane for controlled impedance.

Another object of the present invention is to provide a testsite for accurately testing flat contact LCC IC packages.

Another object of the present invention is to provide a testsite which can utilize a stable temperature test environment.

Another object of the present invention is to provide a testsite utilizing a developing capacitor which can decouple the testsite from surrounding anomolies.

DESCRIPTION OF THE PREFERRED EMBODIMENTS

Figure 1:
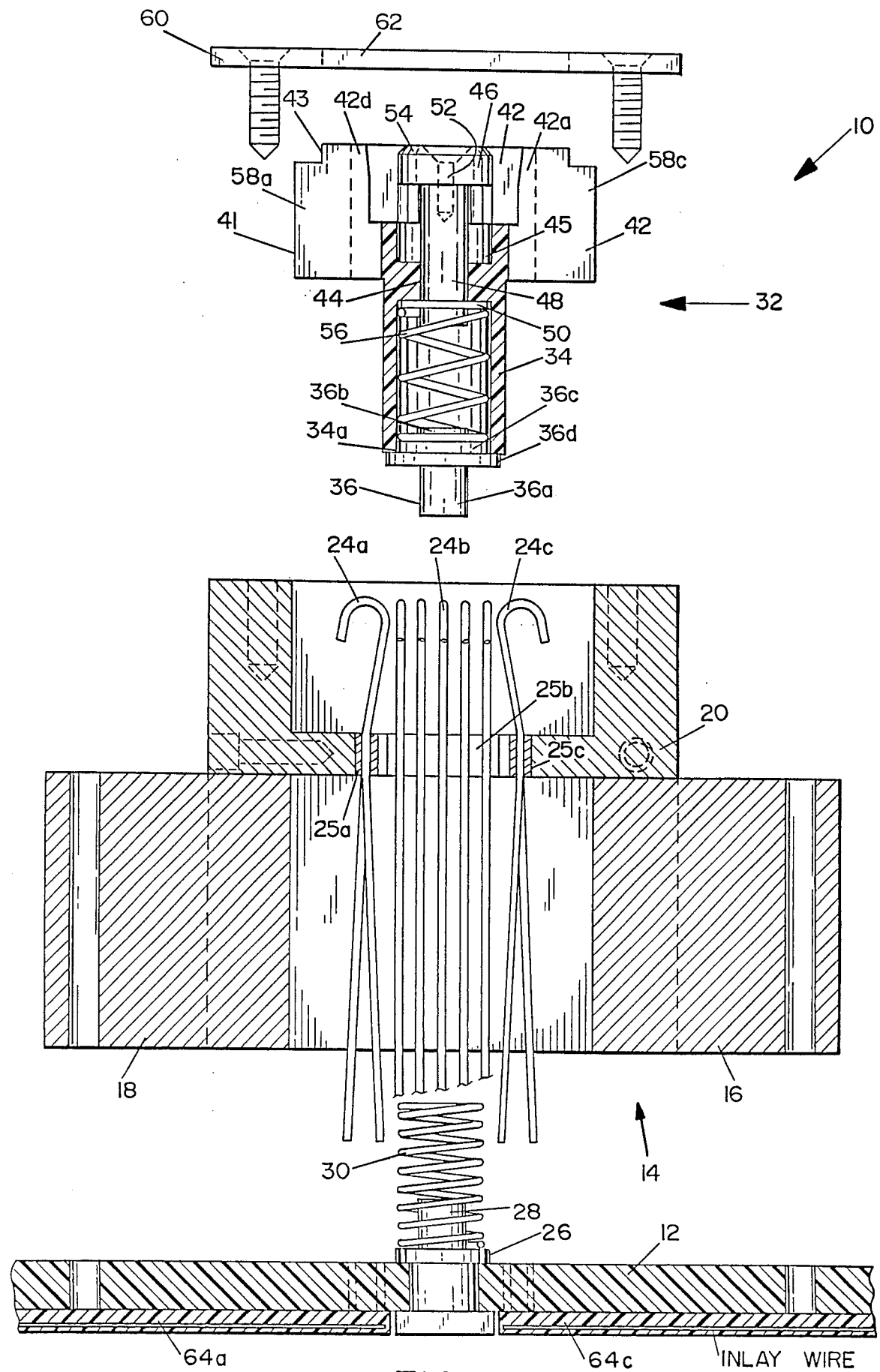
FIG. 1 illustrates an exploded sectional view of a testsite, the present invention.
Figure 3:
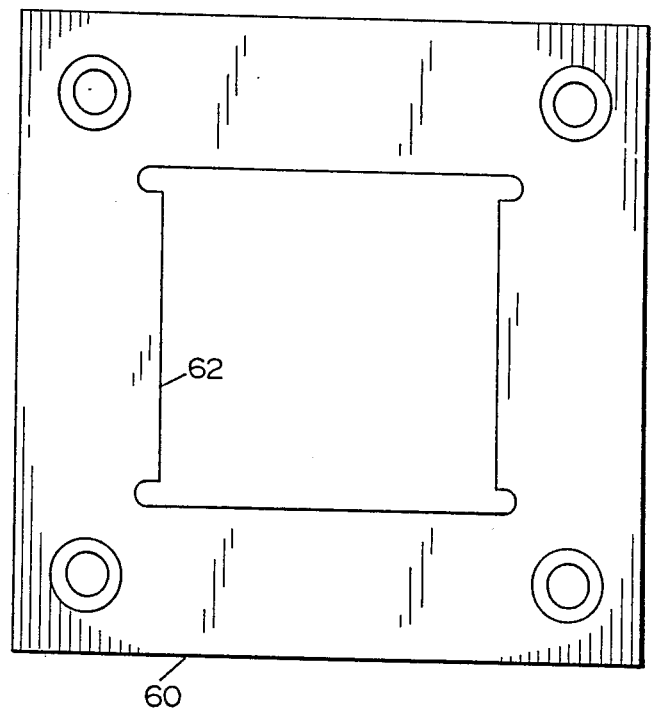
FIG. 3 illustrates a top view and partial cutaway view with the cover removed.
Figure 3:
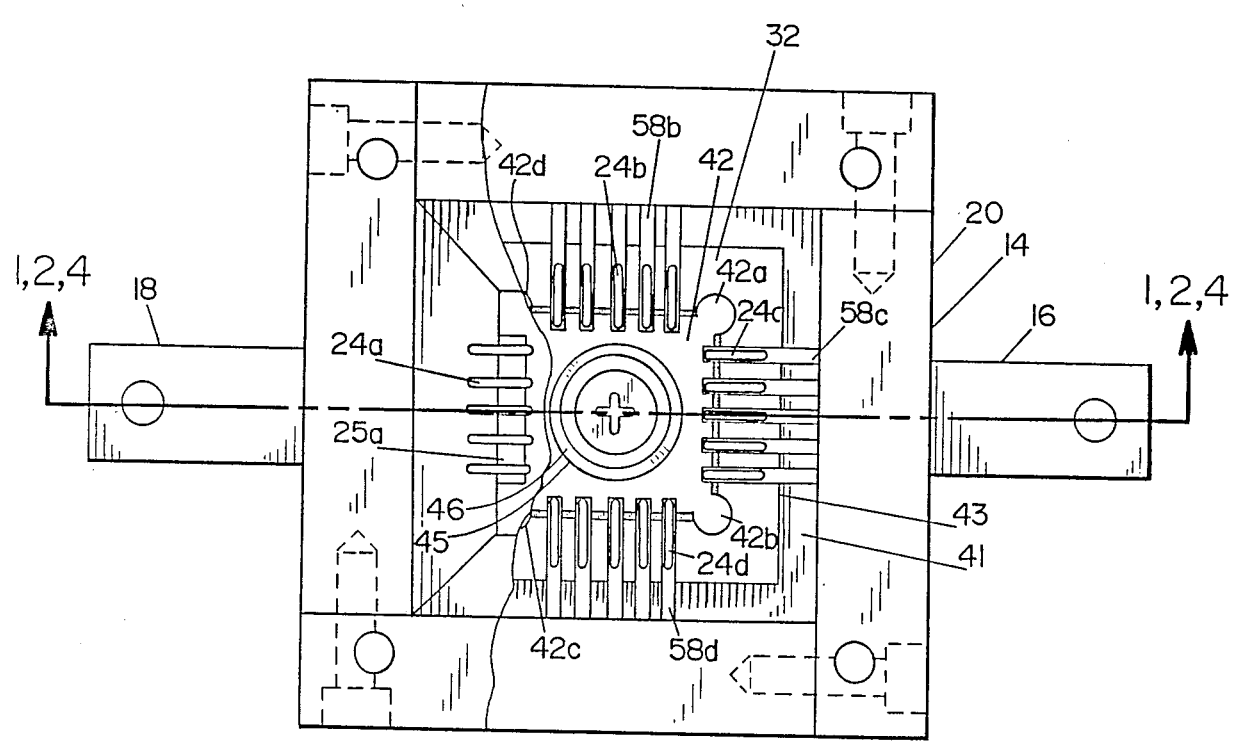

FIG. 1 illustrates an exploded sectional view of a testsite 10, the present invention. The testsite 10 includes a contact printed circuit board 12 for supporting an extender 14, where the extender 14 which can be a machined member, such as aluminum, and includes a right extender flange 16 and a left extender flange 18 for structural support. A frame 20 secures to the extender 14, such as with screws or the like. A plurality of contact wires 24a–24c, with 24d illustrated in FIG. 3, solders to the contact board 12 and extends upwardly as illustrated and affixed within mounting bars 25a–25d where 25d is illustrated in FIG. 3. A spring support 26, including a spring shaft 28 secures to the contact board 12. A large spring 30 positions over the spring support 26 and spring shaft 28.

Figure 4:
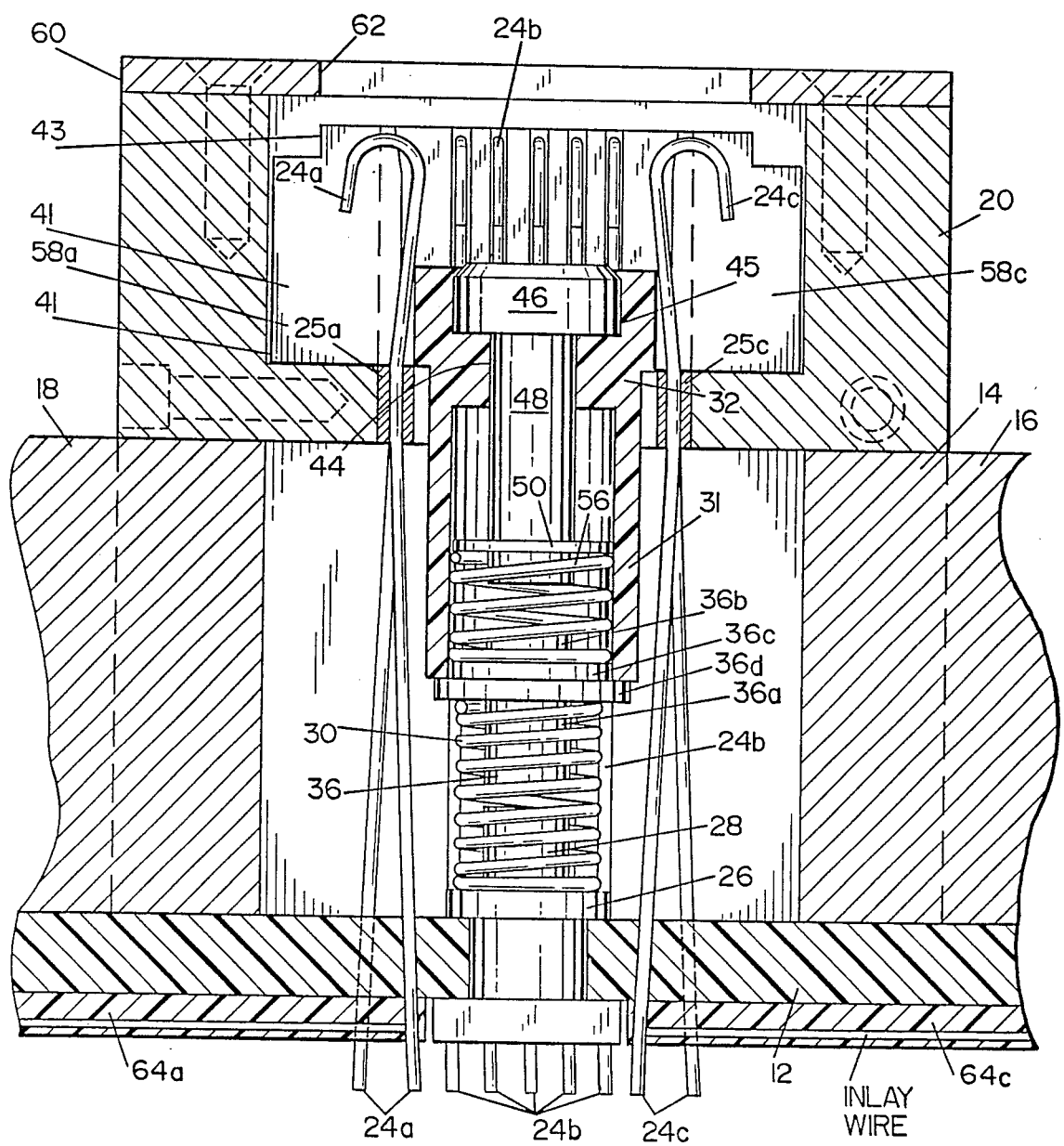
FIG. 4 illustrates a sectional view of the testsite in an operable engaged position where a first spring and second spring are compressed during engagement by an IC and during an electrical testing operation.

A socket assembly 32 includes a spring housing 34 with a spring socket 34a. A dual barrel spring support 36 includes a lower barrel 36a, an upper barrel 36b, a smaller diameter barrel 36c for engaging within the spring socket 34a, and larger diameter 36d for flanging against the base of the spring housing 34. A square shaped, partially beveled wall pocket 42 is positioned within the socket assembly 32, and includes a cylindrical base 45 and rounded corners 42a–42d, as also illustrated in FIG. 3. The socket assembly includes a lower rectangular housing 41 for engaging within the frame 20 and an upper rectangular housing 43 for engaging to a like hole within frame cover 60 as later described. The lower housing 41 also slides within the frame 20, and the upper housing 43 also slides within the cover plate 60. A hole 44 supports a plunger or ejector assembly 46, including a rod 48, a retaining ring 50 on a lower end, and a screw 52 and washer 54 on an upper end. A small spring 56 engages between the retaining ring 50 and the barrel 36c of the dual barrel member 36 within the spring socket 34a of the spring housing 34. A plurality of contact wires guides 58a–58d extend vertically through the upper 43 and lower 41 housings, as also illustrated in FIGS. 3 and 4. A cover plate 60 including a rectangular hole 62 secures with four screws to the frame 20 for containment of the pocket assembly within said frame 20.

Figure 2:
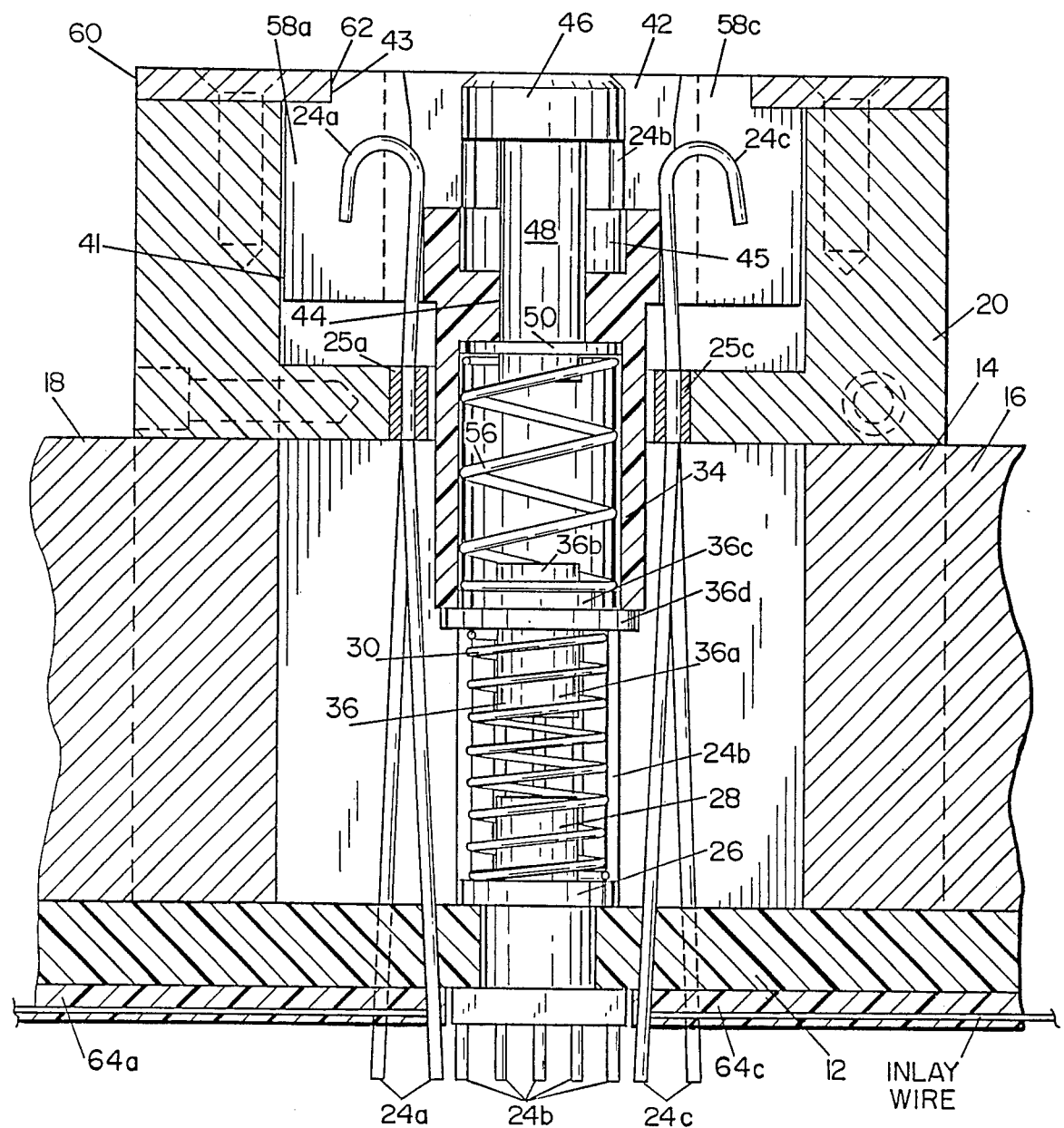
FIG. 2 illustrates a sectional view.

FIG. 2 illustrates a sectional view where all numerals correspond to those elements previously described. In this view, the testsite is assembled and spring loaded for acceptance of an IC package prior to testing.

FIG. 3 illustrates a top view including a partial cutaway view with the cover 60 removed.

FIG. 4 illustrates a sectional view where all numerals correspond to those elements previously described. In this view, the testsite is assembled and both springs are compressed in an operable engaged position during a test.

MODE OF OPERATION

In operation, an IC package is positioned within the pocket 42 of the socket assembly 32 by known integrated circuit handler systems. Subsequently, the IC package is pushed into and against the spring constant of the first spring 56 so as to engage the IC within the pocket 42. The IC is engaged up against the ejector 46 and against the spring constant so as to engage entirely into the pocket 42 so that the ejector pin is engaged entirely within the cylindrical base 45 of the socket assembly 32. On that occurring, the pressure is continuously exerted against the IC so that the entire socket assembly 32 is pushed downwardly into an inner rectangular area within the frame 20 and below the top of the cover 60 carrying the IC within, so that assurance and integral contact is provided between every lead of the IC and each of the contact wires providing contact for subsequent tests. During this action against the second spring 30 and second spring constant, the areas of engagement by each of the contact wires 24a–24d against each of the IC leads is enhanced and increased providing for integral assurance of electrical contact. As the socket assembly 32 descends towards its lowermost position, the most inward walls of guide slots 58a–58d move downwards allowing the contact wires 24a–24d spring properties to position the top portions of those contacts inwardly providing sufficient pressure for adequate electrical contact with the leads of the inset IC. After tests, the second spring returns the socket assembly 32 to a position up and against an inner rectangular area of the cover 60 and the ejector pin 46 ejects the IC from the pocket of the socket by way of the first spring action.

Figure 5:
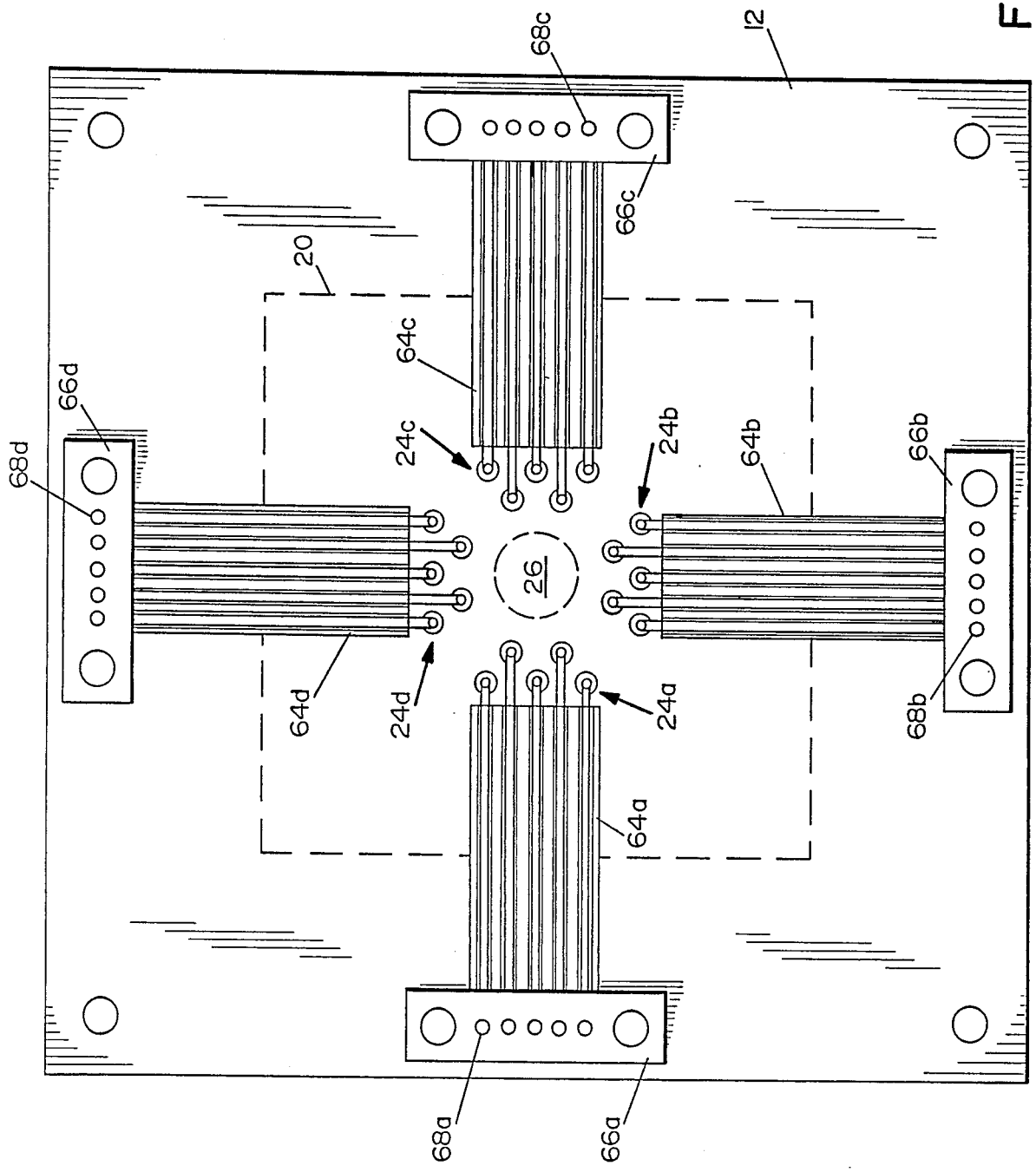
FIG. 5 illustrates a bottom view of an alternative embodiment of a testsite for high frequency test operations.

FIG. 5 illustrates a bottom view of a cabling assembly for high frequency testing operations and for connection to the testsite. Each cable 64a-64d connects to each respective contact wire array and comes out to a wire end 66a-66d which is suitable for a plugable, solderable, weldable, or bolt-on electrical clamp connection to an IC tester. The cable can be impedance controlled, of a finite length, and flexible as required including transmission line characteristics and termination for consistent impedance connections providing for integrity during high frequency testing operations. By controlling the interconnection of the flexible cables to the contact wire arrays and through a suitable electrical connection of the free end of the flexible cable to the IC tester, a controlled impedance can be integrally maintained for purposes of testing at high frequencies up to and well above of the range of 100-200 mHz. The flexible cables 64a-64d include wires positioned in between members of flexible insulation sheets. The dimples 68a-68d terminating at the end of each flexible cable provide for bolt-on connection with a like mating bolt connector.

Figure 6:
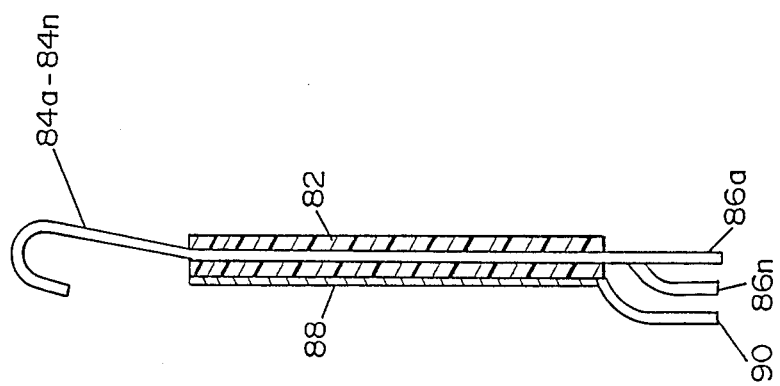
FIG. 6 illustrates a sectional view of an alternative embodiment of a controlled impedance contact wire.

FIG. 6 illustrates a sectional view of a controlled impedance contact wire array 80. The array 80 includes a molded housing support 82 supporting an array of contact wires 84a-84n where the offset wire connections 86a-86n are alternately offset with respect to each other, by way of example or in the alternative, the connections can be in line. A copper sheet 88 with at least one ground tab 90 positions adjacent to the contact wires 84a-84n. The ground plane of the copper sheet 88 provides a distributed controlled impedance over the finite length of the contact wire array 80. The controlled impedance contact wire array can be utilized in the structure of FIGS. 1-4 and with the cable of FIG. 5.

Figure 7:
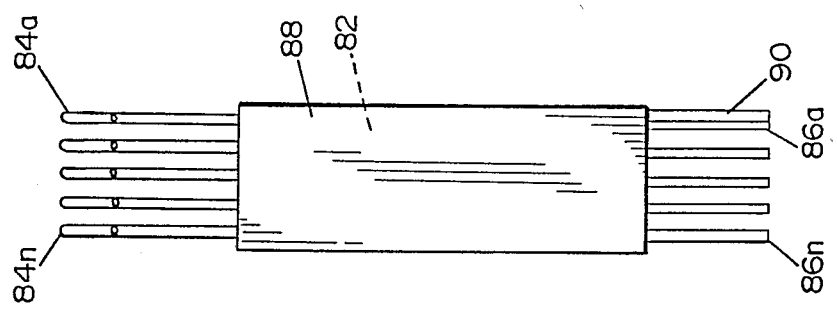
FIG. 7 illustrates a front view of FIG. 6.

FIG. 7 illustrates a front view of FIG. 6 where all numerals correspond to those elements previously described.

The structure of FIGS. 1-7 is primarily designated for a plastic lead chip carrier (PLCC) IC's although suitable adaptives are within the teachings of the specification. The dual barrier spring support 48 can be a continuous member and the members 36c and 36d can be a bushing such as bronze as appropriate in FIGS. 1, 2 and 4 and the specification discussion relating thereto. While controlled impedance cables can be utilized, the invention is not strictly limited to controlled impedance cables. Members 36, 36a and 26b are part of member 48. Member 48 can have a screwdriver slot to assist in assembly.

FIRST ALTERNATIVE EMBODIMENT

Figure 8:
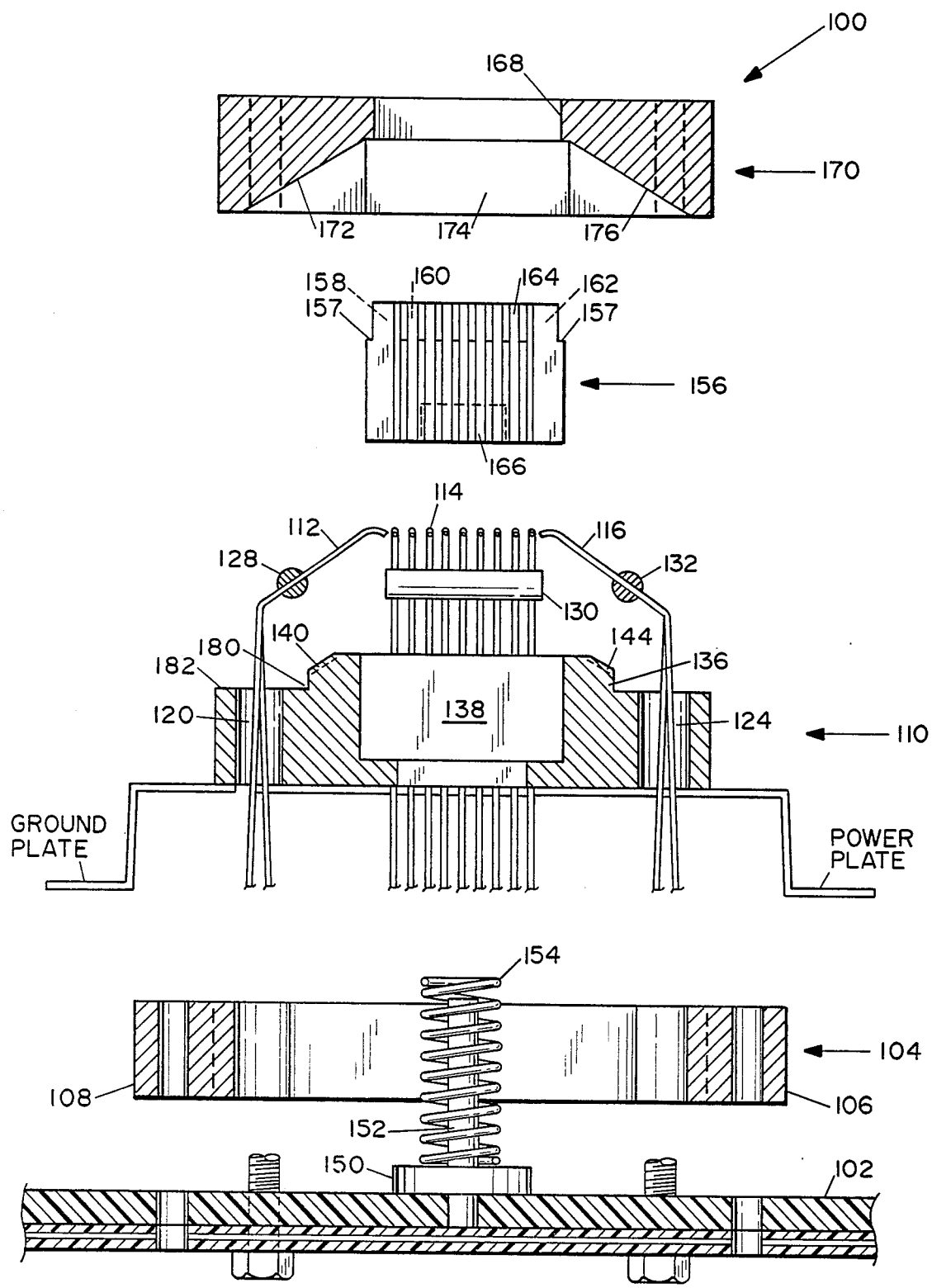
FIG. 8 illustrates an exploded section view of an additional alternate embodiment of a testsite.
Figure 9:
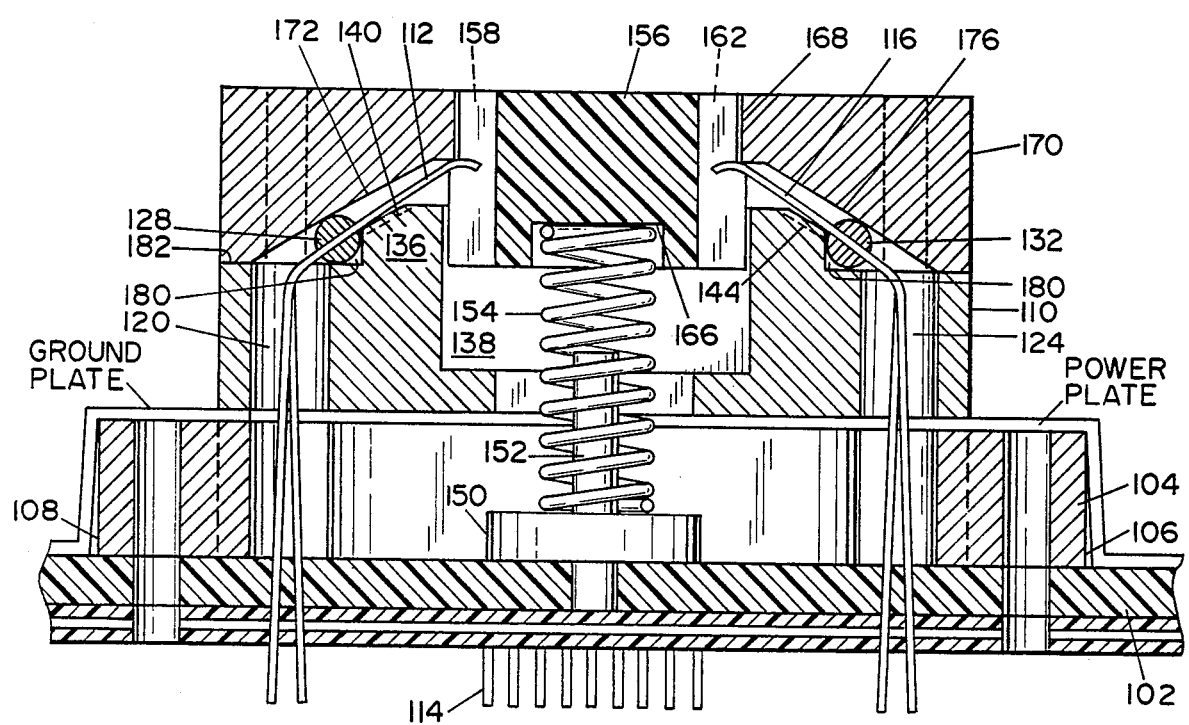
FIG. 9 illustrates a sectional view.
Figure 10:
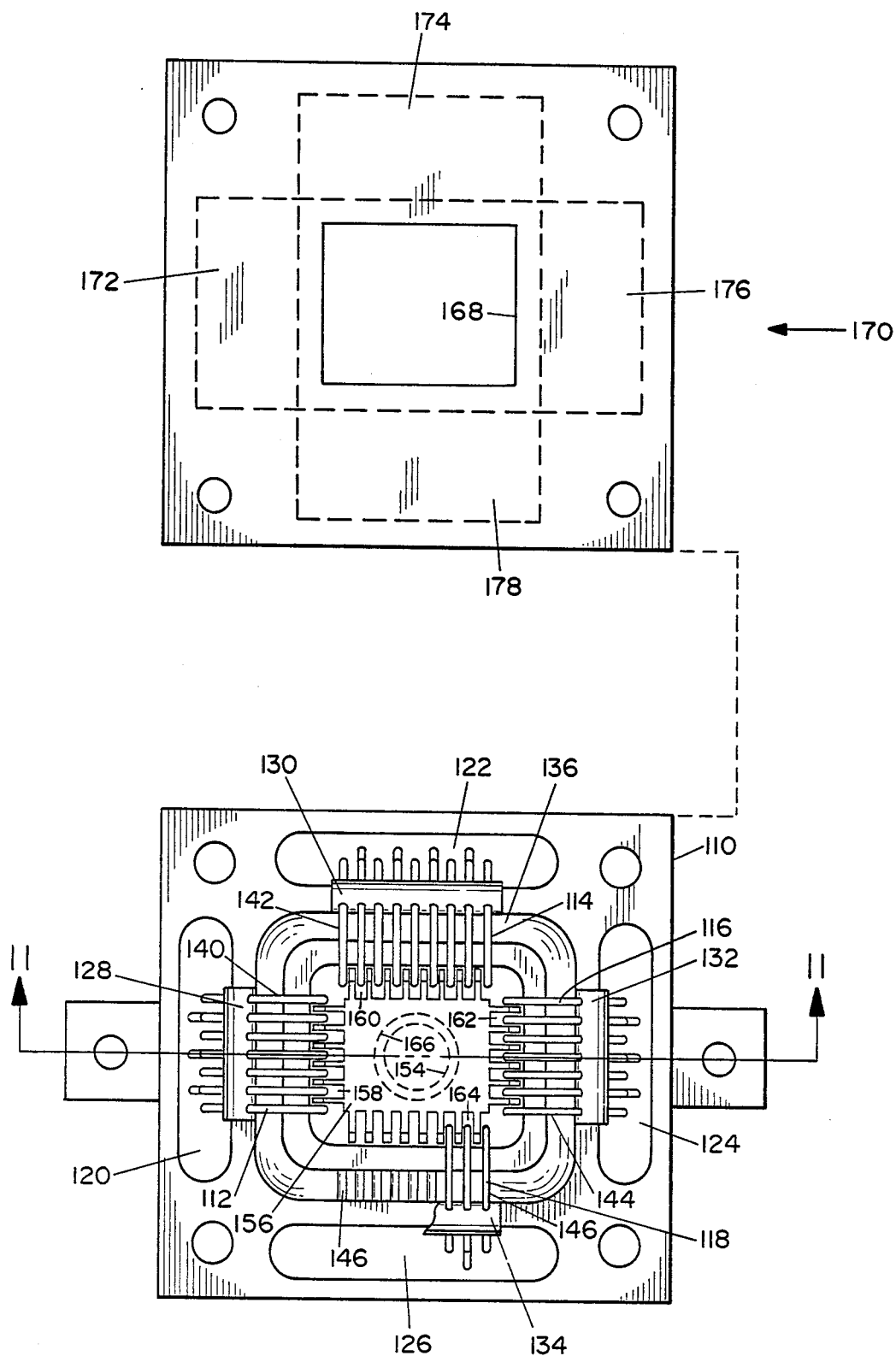
FIG. 10 illustrates a top view with the cover removed.

FIG. 8 illustrates an exploded section view of an additional alternative embodiment of a test site 100 such as for testing of LCC's. The test site 100 includes a contact printed circuit board 102 for supporting a geometrically configured extender 104 where the extender 104 can be a machined member such as aluminum and includes a right extender flange 106 and a left extender flange 108 for structural support and mounting. A frame 110 secures to the extender 104 such as with machine screws or the like. A plurality of similar contact wires 112, 114, 116 and 118 resembling a modified shepard's hook and similar to the shepard's hook of FIGS. 1-8 as illustrated partially in FIG. 10 solders to the printed circuit board 102 and extends upwardly through elongated holes 120, 122, 124 and 126 as illustrated in FIG. 9 and 10 and affix in horizontal non-conducting mounting bars 128, 130, 132 and 134. A raised ramped lip 136 positions about a rectangular receptacle cavity 138 including within the ramped wall surfaces a plurality of wire seat sets 140, 142, 144 and 146. A spring support 150 and a spring shaft 152 secures to the contact board 102. A spring 154 positions over the spring supports and the spring shaft 152.

A rectangular like socket assembly 156 includes a plurality of shoulder notches 157 and a plurality of contact wire guide slots 158, 160, 162 and 164 each with a two side shoulder notch 157 positioned about the sides of the socket 156 as also illustrated in FIG. 10. A spring seat hole 166 in the lower portion of socket assembly 156 engages with the top end of spring 154. The lower portion of socket 156 engages within and moves vertically within the rectangular receptacle cavity 138 of frame 110. The top portion of socket 156 engages within a corresponding hole 168 in a cover plate 170 of the test site 100. The plurality of contact wires 112-118 engage respectively within the plurality of contact wire guide slots 158-160 as illustrated in FIGS. 9 and 10. Cover plate 170 including a rectangular hole 168 secures with four screws through frame 110 and extender 104 for the containment of the socket assembly 156 within the frame 110. Four interior ramped surfaces 172, 174, 176 and 178, as also illustrated in FIG. 10, position on the underside of the top member 170, and engage respective non-conducting mounting bars 128-134 and corresponding contact wires 112-118 into and against the right angled groove 180 formed by the upper planar surface 182 of the frame 110 and the vertical portion of the raised ramp lip 136 as illustrated in FIG. 9.

FIG. 9 illustrates a sectional view of the test site 100 where all numerals correspond to those elements previously described. In this view, the test site is assembled and ready for acceptance of an IC package prior to testing. In particular, the typical securement of the mounting bars 128-134 between the interior ramped surfaces 172-178 and the groove 180 adjacent to the sides of the raised ramped lip 136 illustrated.

FIG. 10 illustrates a top view of the assembled test site 110 with the top member 170 removed. Shown in particular is a cut away view beneath contact wires 118 showing wire seat set 146 which maintains alignment of the contact wires 118 when an IC is depressed and tested on socket assembly 156. Corresponding seats and contact wires about the perimeter of the raised ramped lip 136 function in the same manner.

Figure 11:
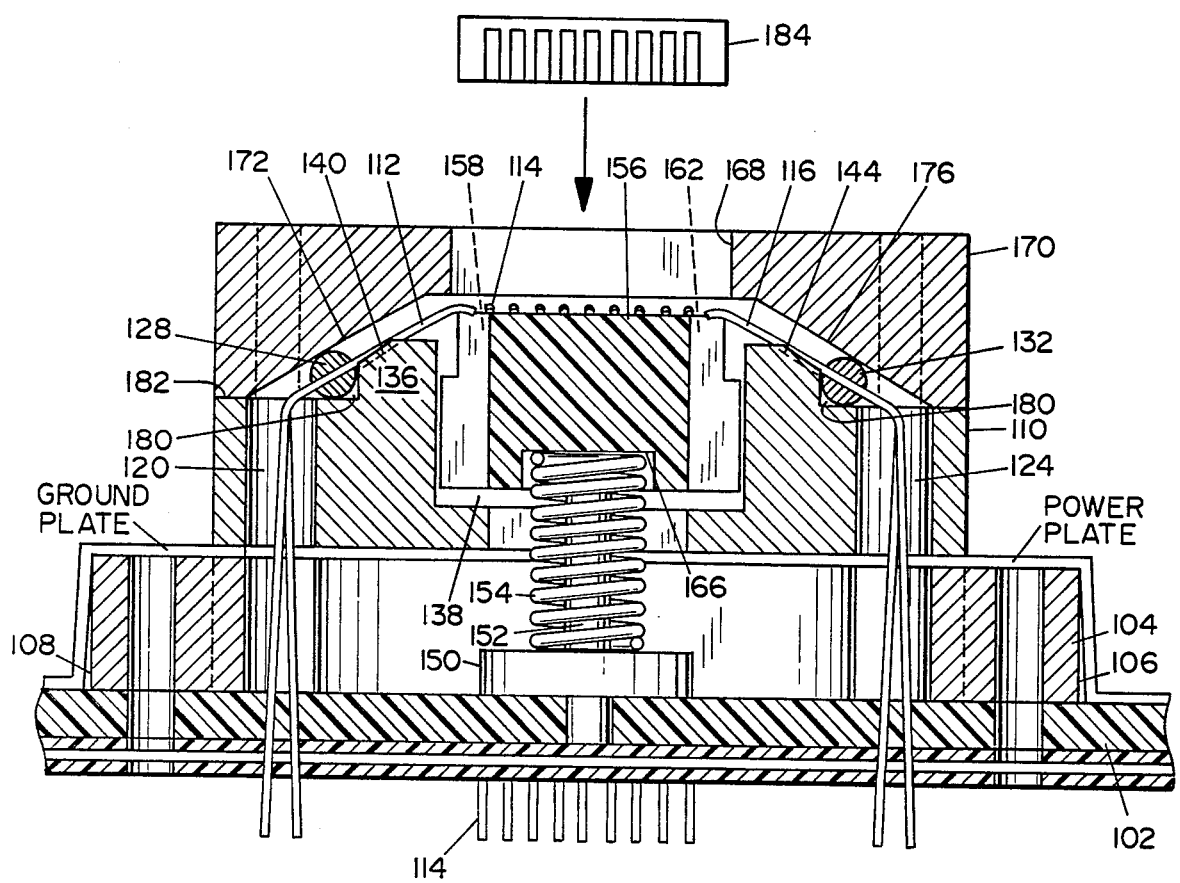
FIG. 11 illustrates a sectional view taken along line 11—11 of FIG. 10 of the testsite alternate embodiment in an operable engaged position where a spring is compressed during engagement by an IC and during an electrical testing operation.

FIG. 11 illustrates a sectional view of the test site alternate embodiment 100 in an operable engaged position where all numerals correspond to those previously described. A LCC IC 184 shown above the test site for ease and brevity of illustration and the socket assembly 156 is illustrated in the depressed position as though the IC 184 was actually engaged upon the socket assembly 156. When the socket 156 assembly is depressed as illustrated, the upper portion of the contact wires 112-118 are exposed for contact with the flat bottom contacts of the IC 184. The contact wires 112-118 are engaged within wire seat sets 140-148 and the spring 154 is loaded for ejection of the IC 184 from the test site 100 subsequent to testing.

MODE OF OPERATION

In operation, of FIGS. 8-11 the IC package is positioned within the rectangular hole 168 of the top member 170 and upon the upper surface of the socket member 156 by known integrated circuit handler systems. Subsequent to insertion, the IC is pushed downward against the spring constant of spring 154. Continuous downward pressure is exerted against the IC moving the IC entirely below the upper surface of the top member 170 so that the IC 184 exerts pressure against the socket 156 which is moved into the rectangular receptacle cavity 138 within frame member 110. As the socket member 156 descends to the lower most position, the slots 158-164 correspondingly descend to expose the uppermost portions of the contact wires 112-118 allowing and providing sufficient spring pressure contact with the leads of the inset IC. As the IC contact descends further, the contact wires 112-118 are deflected downwardly into their respective wire seat sets 140-146 providing positioned alignment and stability until the IC reaches the bottom most travel. The tension and flexing of the contact wires 112-118 against the IC terminals provides that assurance and integral contact is provided between every lead of the IC and each of the contact wires providing contact for subsequent tests. This is advantageous for high frequency testing. After IC testing, the spring 154 returns to socket member 156 to the original position with the shoulder notches 157 engaging against the lower surfaces of the top member 170 at the perimeter of hole 168 and also returns the tested IC to the integrated circuit handler system.

A SECOND ALTERNATIVE EMBODIMENT

Figure 12:
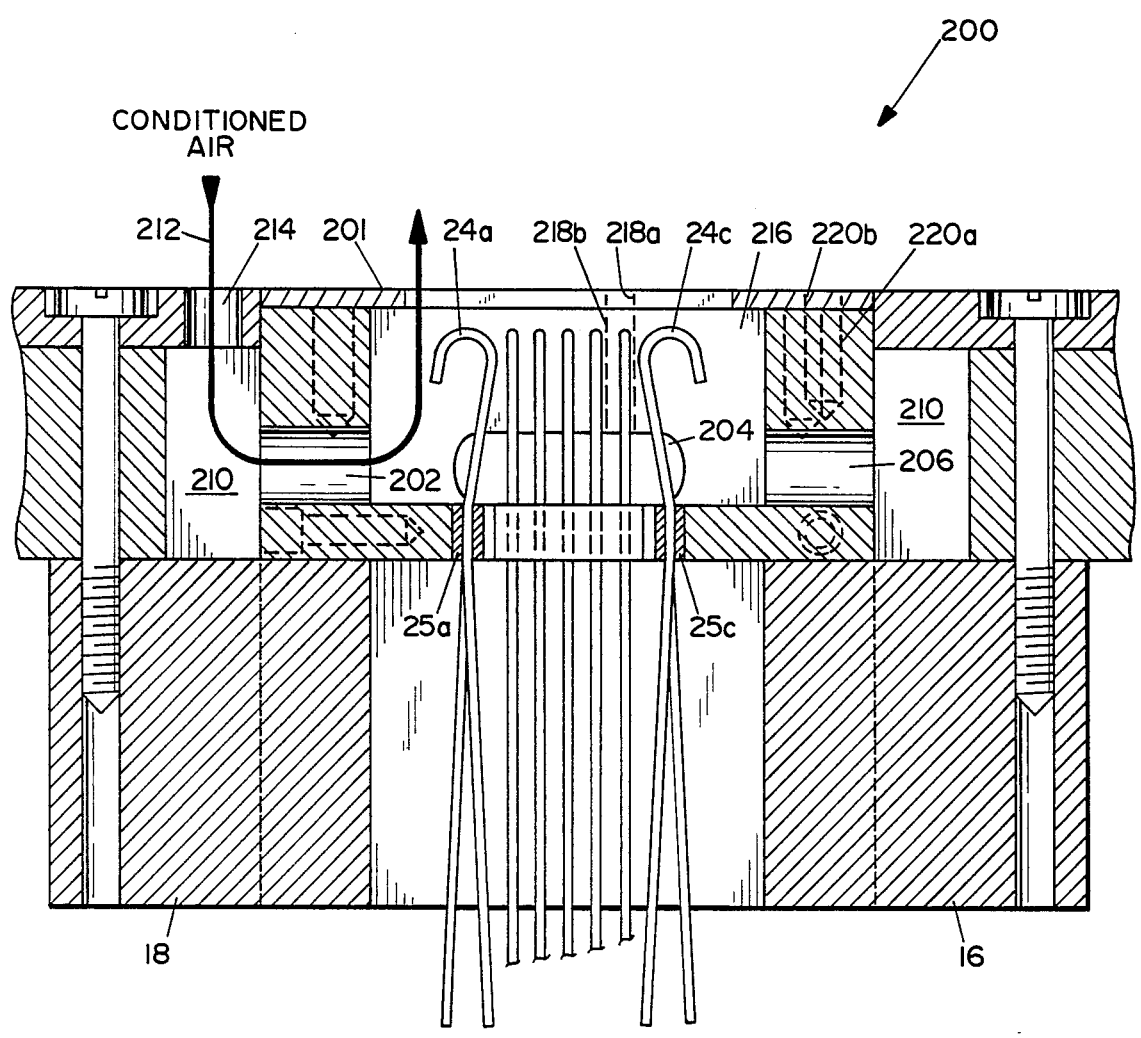
FIG. 12 illustrates another alternate embodiment of FIG. 1 illustrating conditioned air ports.
Figure 13:
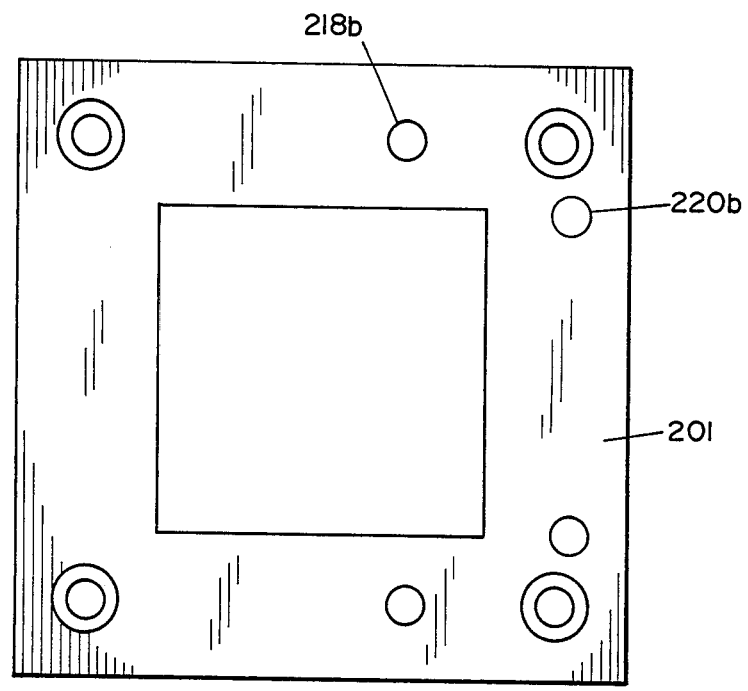
FIG. 13 illustrates a top view of FIG. 12 with the top plate removed.
Figure 13:
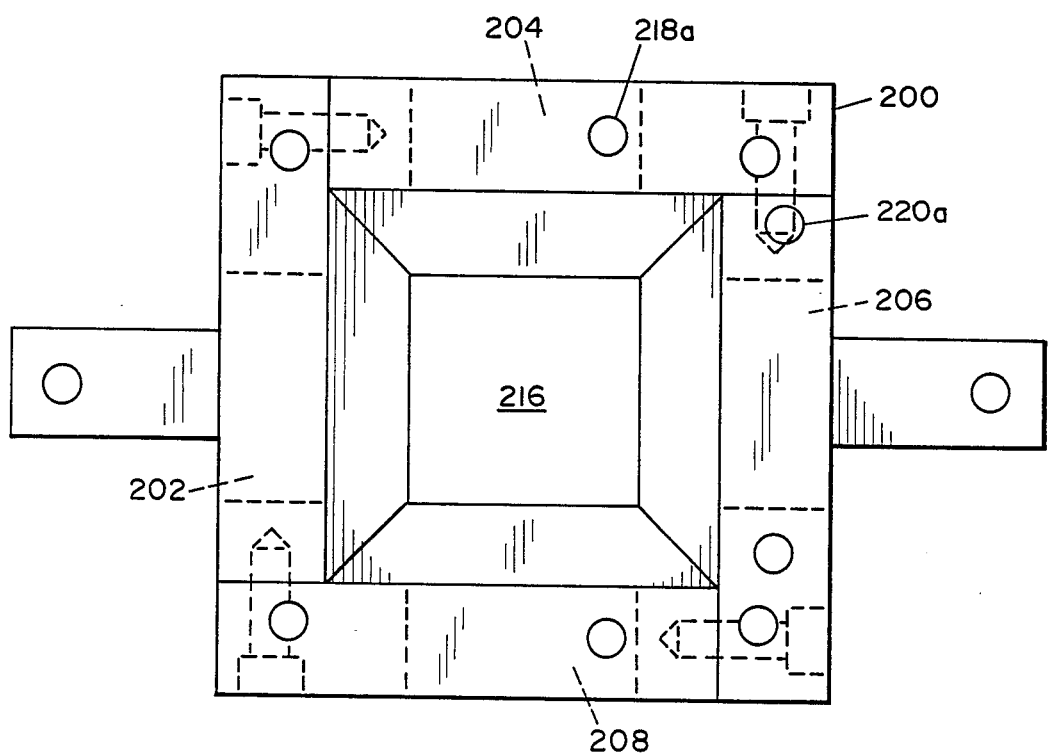

FIG. 12 illustrates an alternate embodiment of a ported frame 200 of FIG. 1 and like FIG. 8 where all numerals correspond to those previously described. The ported frame 200 includes air ports 202-208 positioned in the vertical walls of the frame as illustrated in FIG. 12 and 13. Chamber 210 positions external to and surrounding the ported frame 200. Conditioned temperature controlled air 212 enters the chamber 210 surrounding the ported frame 200, through an orifice 214 flowing through the chamber 210, through ports 202-208 into rectangular chamber 216, and onto the IC being tested to either heat, cool or maintain the temperature of the chamber 216 of the IC being tested. Typical conditioned air flow is illustrated by the conditioned air arrow 212. Temperatures of the input air flow 212 and the frame 200 can be monitored by temperature sensors inserted into portions of the frame. As illustrated in FIG. 13, sensor hole 218a allows for insertion of a temperature probe into the conditioned air stream within air port 204 of the frame 200. Sensor hole 220a allows for insertion of a temperature probe into the body of the frame 200 for monitoring and control of the test site temperature. Hole 218b in the cover 201 corresponds with hole 218a in the frame 200, and hole 220b in the cover 201 corresponds with hole 220a in the frame 200. The temperature probes can be located about the contactor as well as in the contactor.

FIG. 13 illustrates a top view of FIG. 12 with the top plate 201 removed where all numerals correspond to those elements previously described. Shown in particular are the air sensor holes 218a and 218b and 220a and 220b utilized for the monitoring of chamber 216, and frame 200 temperature by the insertion of probes into the corresponding holes.

A THIRD ALTERNATIVE EMBODIMENT

Figure 14:
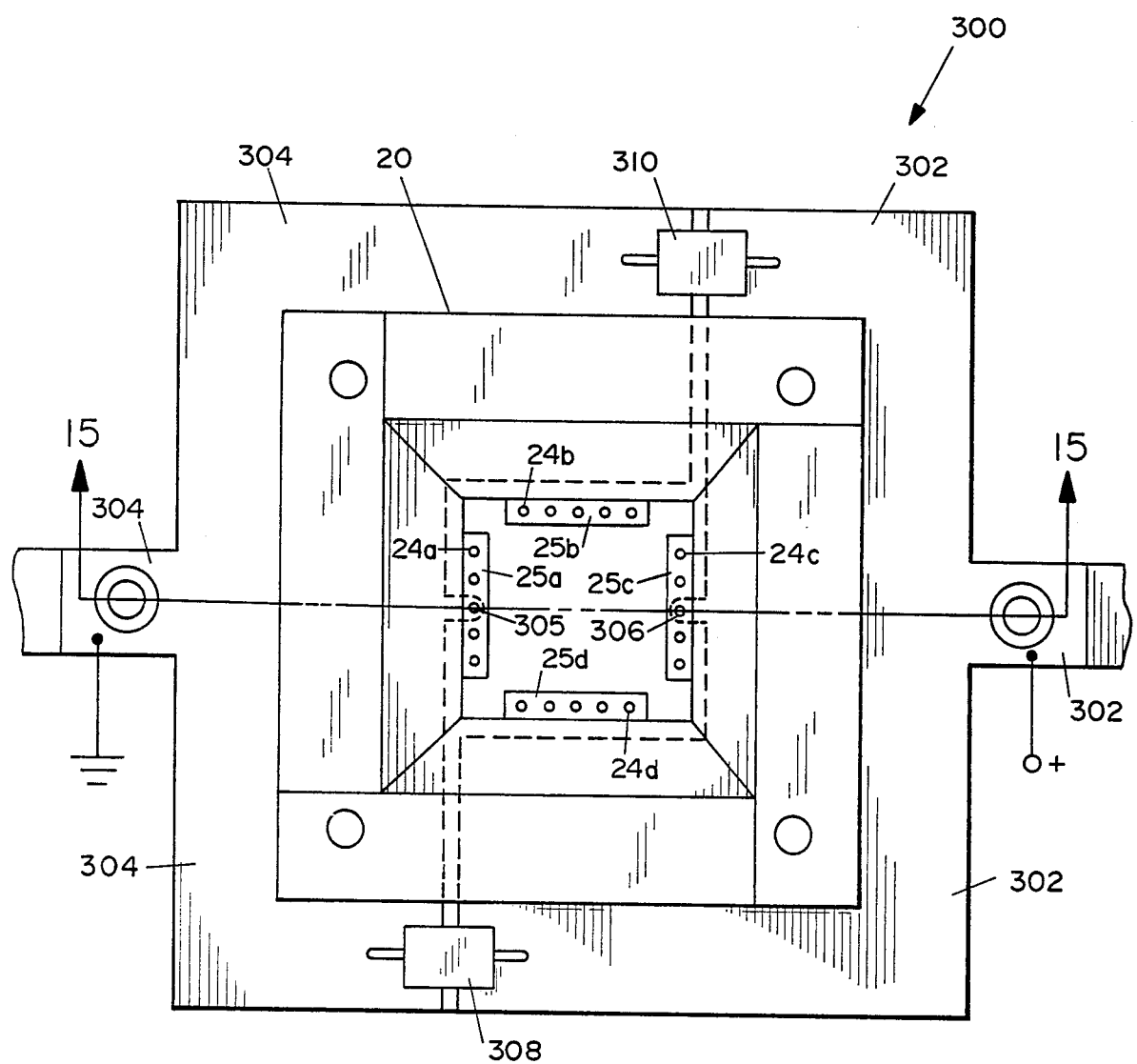
FIG. 14 illustrates a top view alternative embodiment of a testsite utilizing a decoupling capacitor; and, FIG. 15 illustrates a view in cross-section taken along line 15—15 of FIG. 14.
Figure 15:
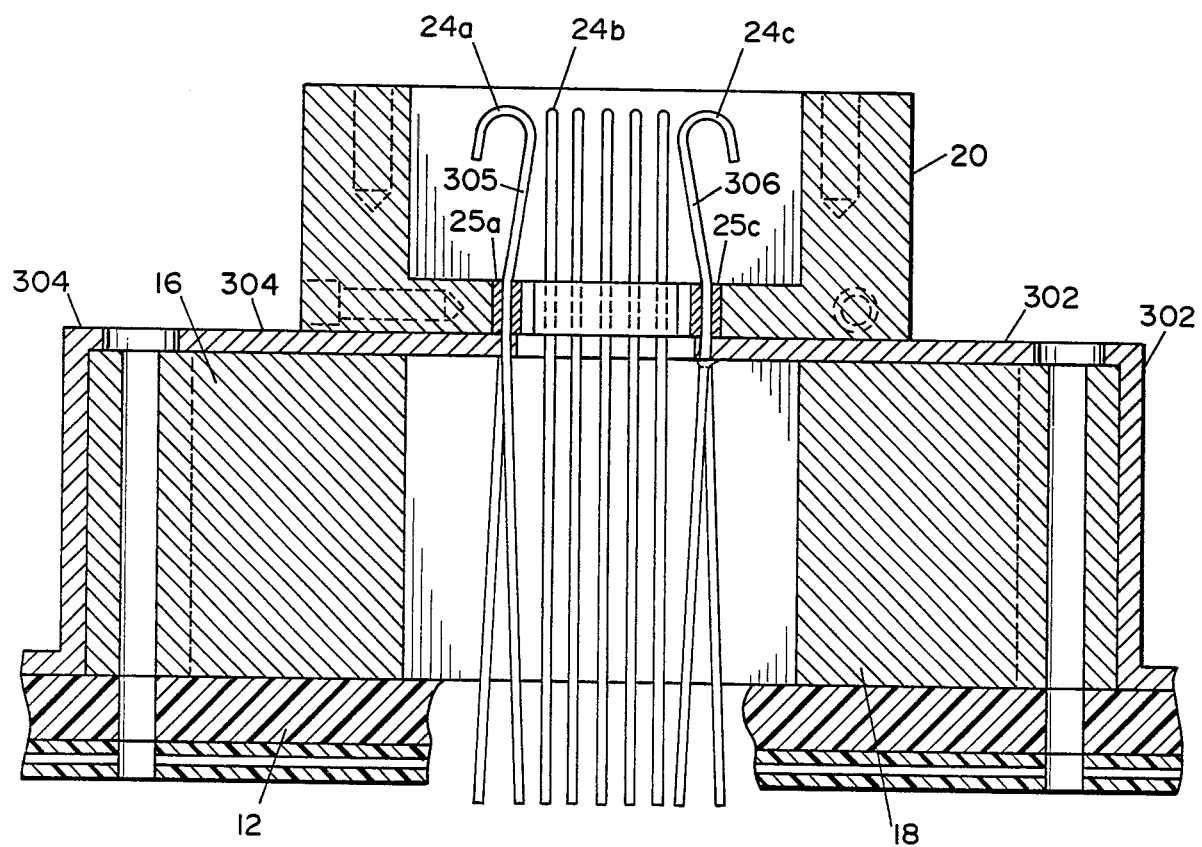

FIG. 14 illustrates a top view of an alternative embodiment of a test site 300 utilizing a decoupling capacitors where all numerals correspond to those elements previously described. Separate conductive plates 302 and 304 are placed between the frame 20 and extenders 16 and 18 as also illustrated in FIG. 15 to decouple the test site from surrounding anomolies and providing that the test site is closer to the circuit. Plate 302 conducts operating voltage to a designated pin 306 of the test system, and in a like manner plate 304 affixes to designated pin 305. Conductive plates 304 and 302, the inner portion of which is shown in dashed lines, effects a ground plane surrounding the bases of the test wires 24a-24d, and is interceded between the IC to be tested and other components of the test site 300. Capacitors 308 and 310 mount between conductive plate 302 and 304 as illustrated in FIG. 14. The top curved portions of pin pluralities 24a-24d are illustrated as though such were cut off just above elements 25a-25d for the purpose of clarity of brevity. The conductive plates can be used to either supply power or as a ground.

FIG. 15 illustrates a view in cross-section taken along line 15—15 of FIG. 14 where all numerals correspond to those elements previously described.

Various modifications can be made to the present invention without departing from the apparent scope thereof.

We claim:

1. An integrated circuit testsite for the testing of leadless ICs comprising:
   a. a printed circuit board with an extender flange mounted thereon, a spring and spring shaft therein, and a frame mounted thereupon, said frame including a plurality of sets of contact wires secured to said printed circuit board;
   b. a receptacle cavity in said frame, a raised ramped lip surrounding said receptacle cavity with wire seats thereupon;
   c. a notched socket assembly fitting into said receptacle cavity and engaging over and about said contact wires; and,
   d. a ramped cover including a hole secured over said frame, said notched socket assembly securing said wire contacts and said notched socket assembly to and within said frame, and to said extender flange and said printed circuit board.

2. Testsites of claim 1 wherein the frame includes a plurality of air sensor holes and a plurality of elongated air ports positioned in the walls of said frame, and a cavity surrounds said frame, said cavity including a conditioned air inlet orifice in said cavity whereby conditioned air flows through said orifice, said cavity and said elongated air ports and out of the frame top to condition and control the temperature of the subject IC being tested.

3. Testsite of claim 1 comprising at least one decoupling capacitor about said frame and said extenders and conductive separated conductive plates positioned between said frame and over said extender, and each of said plates connected to a test pin.

4. Testsite of claim 3 including a ground plane between said frame and said extender flange.

5. Testsite of claim 3 wherein said power plane plate and ground plane plate frame said plates.

6. Testsite of claim 3 including decoupling capacitors connected between said plates.

* * * * *